US012414349B2

(12) United States Patent
Finney et al.

(10) Patent No.: US 12,414,349 B2
(45) Date of Patent: Sep. 9, 2025

(54) SEMICONDUCTOR DIE INCLUDING AN EDGE TERMINATION STRUCTURE LATERALLY BETWEEN AN ACTIVE AREA AND A LATERAL EDGE REGION OF THE DIE

(71) Applicant: Infineon Technologies Austria AG, Villach (AT)

(72) Inventors: Adrian Finney, Villach (AT); Oliver Blank, Villach (AT); Alessandro Ferrara, Villach (AT); Stefan Tegen, Dresden (DE)

(73) Assignee: Infineon Technologies Austria AG, Villach (AT)

( * ) Notice: Subject to any disclaimer, the term of this patent is extended or adjusted under 35 U.S.C. 154(b) by 435 days.

(21) Appl. No.: 17/946,539

(22) Filed: Sep. 16, 2022

(65) Prior Publication Data

US 2023/0088305 A1 Mar. 23, 2023

(30) Foreign Application Priority Data

Sep. 21, 2021 (EP) .................................... 21198026

(51) Int. Cl.
*H10D 64/00* (2025.01)
*H10D 30/66* (2025.01)
*H10D 62/10* (2025.01)

(52) U.S. Cl.
CPC ......... *H10D 64/117* (2025.01); *H10D 30/665* (2025.01); *H10D 30/668* (2025.01); *H10D 62/102* (2025.01); *H10D 64/115* (2025.01)

(58) Field of Classification Search
CPC .. H10D 64/117; H10D 64/115; H10D 30/668; H10D 62/102; H10D 30/665

USPC ......................................................... 257/310
See application file for complete search history.

(56) References Cited

U.S. PATENT DOCUMENTS

| 8,829,607 B1* | 9/2014 | Hsieh | H01L 29/7811 |
| | | | 257/334 |
| 2005/0275016 A1* | 12/2005 | Qu | H01L 29/7803 |
| | | | 257/342 |
| 2011/0163409 A1* | 7/2011 | Mizushima | H01L 29/407 |
| | | | 257/484 |
| 2012/0043602 A1* | 2/2012 | Zeng | H10D 62/107 |
| | | | 257/329 |

(Continued)

FOREIGN PATENT DOCUMENTS

| DE | 102005041322 A1 | 3/2007 |
| EP | 3624201 A1 | 3/2020 |
| WO | 2005065385 A2 | 7/2005 |

*Primary Examiner* — Norman D Richards
*Assistant Examiner* — Colin Russell McCutcheon
(74) *Attorney, Agent, or Firm* — Murphy, Bilak & Homiller, PLLC (57) ABSTRACT

The application relates to a semiconductor die including a device in an active area of the die. The device includes a field electrode region formed in a field electrode trench extending vertically into a semiconductor body. The field electrode region includes a first and a second field electrode stacked vertically above each other in the field electrode trench. An edge termination structure laterally between the active area and a lateral edge region of the die includes a first and a second shield electrode arranged laterally consecutive between the active area and the lateral edge region to stepwise decrease an electrical potential between the edge region and the active area.

18 Claims, 6 Drawing Sheets

(56) References Cited

U.S. PATENT DOCUMENTS

| | | | |
|---|---|---|---|
| 2012/0217580 A1* | 8/2012 | Mauder | H10D 30/0297 257/E29.256 |
| 2016/0043168 A1 | 2/2016 | Ding et al. | |
| 2020/0058745 A1* | 2/2020 | Chen | H01L 29/7811 |

* cited by examiner

SEMICONDUCTOR DIE INCLUDING AN EDGE TERMINATION STRUCTURE LATERALLY BETWEEN AN ACTIVE AREA AND A LATERAL EDGE REGION OF THE DIE

TECHNICAL FIELD

The present disclosure relates to a semiconductor die comprising a device in an active area.

BACKGROUND

The device can for instance comprise a gate region aside a channel region to control a current flow. Moreover, it comprises a field electrode region in a field electrode trench etched into the semiconductor body, which can for instance increase the breakdown voltage.

SUMMARY

It is an object of the present application to provide a semiconductor die with improved characteristics.

This object is achieved by a semiconductor die which has at least two field electrodes stacked in the field electrode trench. Moreover, the die comprises an edge termination structure with at least two shield electrodes arranged laterally consecutive between the device and a lateral edge region of the die and configured to stepwise decrease an electrical potential between the edge region and the active area. The at least two shield electrodes are arranged laterally aside each other, e. g. next to each other in separate trenches, a portion of the semiconductor body arranged between the trenches (e. g. viewed in a second vertical cross-section, see in detail below).

The stacking of the field electrodes in the field electrode trench can allow for an integration of a series of low-voltage geometries which together support a higher voltage. This can for instance reduce the dependence of $R_{on} \cdot A$ of the breakdown voltage, e. g. allow for a $R_{on} \cdot A$ reduction while maintaining a certain breakdown voltage or, vice versa, allow for an increased breakdown voltage. Compared to a design with one single field electrode, the stacked field electrodes can result in a higher voltage between the edge region and the active area of the die. In consequence, a lateral shielding of the active area with one single shield electrode would e.g. require a respectively thicker oxide, for instance significantly thicker than the field oxide of the field electrodes in the active area. Otherwise, by arranging the at least two shield electrodes laterally consecutive between the device and the lateral edge of the die, each shield electrode has to support only a portion of the electrical potential between the edge and the active area. This can for instance allow for thinner field dielectrics (compared to the one shield electrode design), improving for example the manufacturability and/or allowing for a smaller pitch.

Particular embodiments and features are presented throughout this disclosure. The disclosure relates to apparatus and device aspects, but also to method and use aspects. If for instance a device manufactured in a specific way is described, this is also a disclosure of a respective manufacturing process, and vice versa. In general words, this application suggests a device with at least two field electrodes stacked in one trench combined with an edge termination structure comprising at least two shield electrodes laterally aside each other, each shield electrode configured to support only a portion of the electrical potential between the active area with the device and the edge region of the die, e. g. of the drain/source potential.

The field electrodes are "stacked vertically" in the field electrode trench, which means that they capacitively couple to different vertical sections of the semiconductor body, e. g. different sections of a drift region into which the field electrode trench extends vertically. In particular, the first field electrode can couple to a first section of the drift region and the second field electrode can couple to a second section thereof, the first section arranged below the second section. In addition to the vertical stacking, the field electrodes can, optionally, be nested one in the other with respect to the horizontal direction, namely be formed with a vertical overlap, see FIG. 1 for illustration (the dashed lines). This can for instance allow for an increased or adapted capacitive coupling between the field electrodes, particularly in the larger active area so that the overall capacitive ratio of the combination of active area and other smaller area structures such as the termination are for example suitably adjusted.

Figure 3:
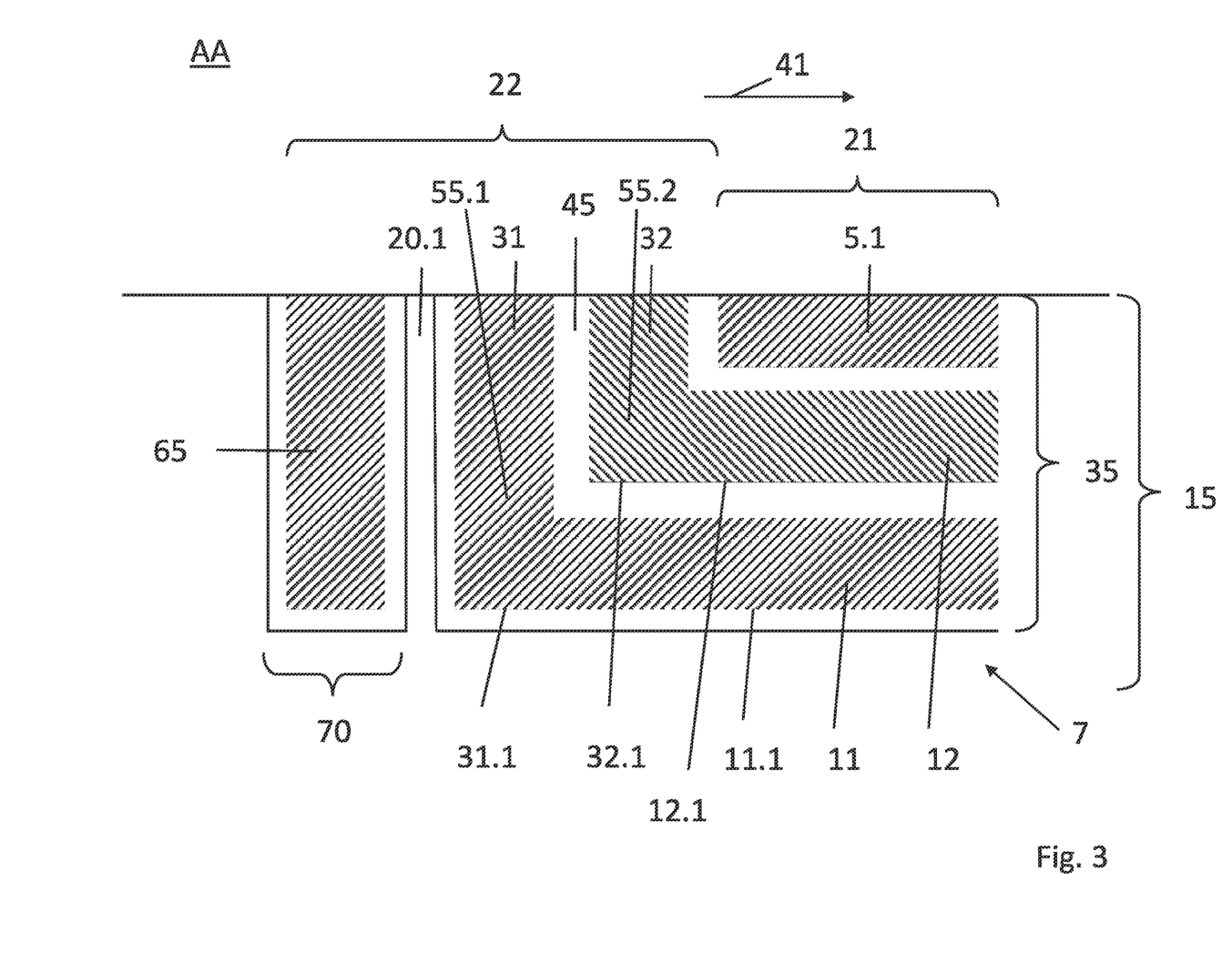
FIG. 3 illustrates the die of FIG. 2 in a first vertical cross-section.

The laterally consecutive shield electrodes can be arranged in separate trenches as mentioned or in a common trench, wherein a combination of some shield electrodes formed in the same trench and another or other shield electrode(s) formed in separate trenches is possible as well, see FIG. 3 for illustration. "Laterally" refers to the lateral direction, which lies perpendicular to a vertical direction. Laterally, e. g. the area of the die is taken. "Vertically" refers to the vertical direction, which lies for instance perpendicular to a surface of the die, e. g. a front or backside surface of the semiconductor body. "Deeper" or "below" means at a larger vertical distance from the frontside of the die or semiconductor body, wherein "above" or "higher" means at a smaller vertical distance from the frontside.

Due to the "laterally consecutive" arrangement, a straight horizontal line can, from the edge region towards the active area, intersect one shield electrode after the other, e. g. the second shield electrode after the first shield electrode and, if provided, a third shield electrode after the second shield electrode (and an $n^{th}$ shield electrode after the third shield electrode). In between two respective shield electrodes, the horizontal straight line intersects a respective dielectric material respectively, e. g. silicon oxide. In case of the separate trench design, it will additionally intersect the semiconductor body (e. g. respective portion of the p well) in between the respective two shield electrodes, e. g. intersect the dielectric material, the semiconductor body and the dielectric material between two respective shield electrodes. Generally, the respective straight horizontal line lies parallel to a lateral direction, for instance to the first or to the second lateral direction discussed below. In terms of a vertical position, the straight horizontal line can for instance be arranged on the same height as a gate electrode of the device, namely intersect the gate electrode in the active area and intersect the shield electrodes in the edge termination structure.

In addition to the field electrode region, the device can comprise a gate and a channel region, e. g. laterally aside each other. The gate region can comprise a gate electrode and a gate dielectric which capacitively couples the gate electrode to the channel region. By applying a voltage to the gate electrode, a channel path formation and current flow can be controlled. The gate electrode can for instance be formed in a trench etched into the semiconductor body, wherein the gate and the field electrode region can be arranged in separate trenches or in particular in the same trench, namely the field electrode region below the gate region.

The device can in particular be a field effect transistor comprising a source and a drain region. Referring to a source and a drain region of a first conductivity type, the channel region can be formed in a body region of a second conductivity type opposite to the first conductivity type. In particular, the source region can be formed at a frontside of the semiconductor body and the drain region at a backside thereof, the channel region and the drift region arranged vertically between, e. g. the drift region between the channel region and the drain region. The drift region can be of the first conductivity type as well, wherein its dopant concentration is lower compared to the drain region. As a power device, such a transistor can for instance have a breakdown voltage of at least 10 V, 20 V, 30 V, 40 V or 50 V, possible upper limits being for example not more than 800 V, 600 V, 400 V or 200 V.

The shield electrodes supporting respectively a portion of the electrical potential can for instance be respectively biased to a voltage$\leq V_{ds}/2$, e.g. to $V_{ds}/n$, wherein n is the number of laterally consecutive shield electrodes and Vas is the drain source voltage. In general, a respective biasing can for instance be achieved by actively driving the shield electrodes, for instance with an external driver. In particular, however, a voltage divider can be used, e. g. a resistive potential divider (for instance in slow switching or steady-state operation) and/or a capacitive voltage divider (e. g. in switching or fast-switching operation). Likewise, the stacked field electrodes can for instance be biased to $V_{ds}/n$, wherein n is the total number of field electrodes in the field electrode trench.

In an embodiment, the first shield electrode is electrically connected to the first field electrode and/or the second shield electrode is electrically connected to the second field electrode. If present, a third shield electrode can be electrically connected to a third field electrode or, in general words, an $n_{th}$ shield electrode can be electrically connected to an $n_{th}$ field electrode. A respective wiring can for instance be realized in a metallization layer above, the respective field and shield electrodes connected for example via vertical interconnects to the metallization layer. Alternatively or in addition, e. g. for at least some electrodes, the wiring can be realized vertically inside the semiconductor body, e. g. inside a common trench, see below.

In an embodiment, the first field electrode is arranged vertically below the second field electrode, namely capacitively couples to a first section of the drift region which is arranged below a second section to which the second field electrode couples. The first field electrode can in particular be the lowermost field electrode in the trench. If present, a third field electrode is arranged above the second field electrode, namely couples to a third section of the drift region arranged above the second section. In general words, an $(n+1)^{th}$ field electrode is arranged above the $n^{th}$ field electrode. Generally in this disclosure can be any natural number>1, possible upper limits being for instance 10, 8 or 6. Generally, the total number of shield electrodes can in particular be identical to the total number of field electrodes.

The first shield electrode can be arranged laterally outside of the second shield electrode, and a third shield electrode, if present, can be arranged laterally inside of the second shield electrode. "Laterally outside" means closer to the lateral edge region, namely to the lateral edge of the die, whereas "laterally inside" means closer to the active area and the device. As far as the trenches of the edge termination structure and their arrangement with respect to each other is described, this refers to the structure as formed on one side of the active area (e.g. seen in a vertical cross-section, a shield electrode trench on one side of the active area is not compared with a shield electrode trench on the other side thereof). In general words, the $(n+1)^{th}$ shield electrode is arranged laterally inside of the $n^{th}$ shield electrode.

In an embodiment, the first shield electrode has a greater extension in the vertical direction than the second shield electrode, the first shield electrode can in particular extend deeper vertically downwards than the second shield electrode. The second shield electrode can for instance extend deeper vertically downwards then a third shield electrode, if present. In general words, an $(n-1)^{th}$ shield electrode can extend deeper than an $n^{th}$ shield electrode. While the shield electrodes have different vertical extensions, their shield electrode trenches can in particular have the same vertical extension, e.g. extend to the same depth. Independently of these details, the shield electrode or electrodes can respectively extend vertically upwards up to a frontside of the semiconductor body, their upper ends can in particular lie flush in the frontside and on the same vertical height.

In an embodiment, a lower end of the second shield electrode is arranged on the same vertical height as a lower end of the second field electrode, e.g. seen in a vertical cross-section, in particular in a first or a second vertical cross-section, see in detail below. Alternatively or in addition, a lower end of the first field electrode can be arranged on the same vertical height as a lower end of the first shield electrode, e. g. seen in the first vertical cross-section (see FIG. 3 for illustration), and/or can be arranged on the same vertical height as a lower end of "another field electrode" formed below the second shield electrode, e.g. seen in the second vertical cross-section (see FIG. 4 for illustration). Independently of these details, the shield electrode or electrodes can respectively extend upwards up to a frontside of the semiconductor body, their upper ends can in particular lie flush in the frontside.

As discussed already, the edge termination structure can additionally comprise a third shield electrode laterally inside of the second shield electrode, namely between the second shield electrode and the active area. In the field electrode trench, a third field electrode can be formed above the second field electrode, it can particularly be electrically connected to the third shield electrode. In general words, an $n^{th}$ field electrode can be arranged above the $(n-1)^{th}$ field electrode in the field electrode trench and be electrically connected to an $n^{th}$ shield electrode arranged laterally inside of the $(n-1)^{th}$ shield electrode.

Particular embodiments relate to the design or arrangement in "a first vertical cross-section", its sectional plane lying parallel to the vertical direction and to a first lateral direction. In the first lateral direction, the field electrode trench can for instance have a longitudinal extension in the active area. In an embodiment, the first and the second shield electrode, as well as a third or $n^{th}$ shield electrode, if present, are arranged in a common trench seen in the first vertical cross-section. In particular, the same elongated trench can extend out of the active area up into the edge termination structure, comprising the stacked field electrodes in the active area and the laterally consecutive shield electrodes in the edge termination structure.

In a particular embodiment, the first shield and field electrode formed in the common trench are made of the same continuous field electrode material. Alternatively or in addition, the second shield and field electrode arranged in the common trench are made of the same continuous field electrode material. In general words, an $n^{th}$ shield and field electrode arranged in the common trench can be made of the same continuous field electrode material. The "same continuous field electrode material" can for instance extend without an interruption between the respective shield and field electrode; in other words, a continuous transition without a material boundary in between is formed.

Generally, the first shield and field electrode arranged in the common trench can have a basically L-shaped profile seen in the first vertical cross-section. In an embodiment, an upper edge of a transition portion between the first shield and field electrode has a curved shape seen in the first vertical cross-section. The curved shape can be formed between the two legs of the L-profile, resulting in a concavely shaped upper edge. Alternatively or in addition, the lower edge of the transition portion or first shield electrode can have a convex shape seen in the first vertical cross-section. This can for instance result from an etch process step, e. g. from the trench etch (in particular in case of the bottom shield electrode) or from an isotropic recess etch, e. g. of the shield electrode below (the isotropic etch can for instance have a higher selectivity Si:SiO$_2$ compared to an anisotropic etch that can be an alternative in general). In case that the upper edge and the lower edge have a curved shape, they can have the same or in particular different radii, e.g. the upper edge a larger radius than the lower edge.

In an embodiment, an additional trench with an additional shield electrode can be arranged laterally outside, namely closer to the lateral edge region of the die than the common trench with the first and second shield electrode. Seen in the first vertical cross-section, the additional trench is separated from the common trench by a portion of the semiconductor body. Nonetheless, the additional shield electrode and the first shield electrode can for instance be electrically connected to each other (be on the same electrical potential), e.g. via a metallization layer above. Seen in a vertical top view, the additional trench can have a longitudinal extension, e.g. perpendicular to the common/elongated trench with the shield and field electrodes and/or in parallel to the edge of the die. In particular, the additional trench can surround the active area completely, namely form a closed line (and comprise for instance the first shield electrode when viewed in the second vertical cross-section, see in detail below).

Laterally inside of the surrounding trench, a well region of a second conductivity type can be formed, which comprises for instance the body region in the active area, e.g. a p well. Laterally outside, the semiconductor body can also be doped, e.g. with the second conductivity type as well, the outer region being in particular isolated from the inner well region. Independently of these details, the additional trench can have the same vertical extension like the common trench or can particularly extend deeper. In consequence, a lower end of the additional shield electrode can be arranged at a greater vertical depth than a lower end of the first field electrode.

Particular embodiments relate to a second vertical cross-section, the sectional plane lying parallel to the vertical direction and a second lateral direction. In the second lateral direction, a plurality of device cells or in particular field electrode trenches can be arranged one aside the other in the active area of the die. Alternatively or in addition, the second lateral direction can lie perpendicular to stripe-shaped gate and/or field electrode trenches in the active area. In an embodiment, the first shield electrode is arranged in a first trench and the second shield electrode is arranged in a second trench, wherein these trenches are separated from each other by a portion of the semiconductor body when viewed in the second cross-section. In particular, a shield electrode can be arranged in a separate trench at least when viewed in the second vertical cross-section. In general, each respective trench and the respective shield electrode can extend around the active area, e.g. over the whole circumference. In particular, however, the shield electrode trenches separated from each other seen in the second vertical cross-section can only extend along one side of the active area, e. g. along one side of the die. The shield electrodes and trenches can in particular have a stripe shape and lie parallel to stripe-shaped field electrode trenches in the active area.

The embodiments described above relating to the shield electrodes integrated in the common trench seen in the first vertical cross-section can also be combined with the separate trench embodiment in the same die. The first vertical cross-section can for instance lie parallel to stripe-shaped field electrode trenches in the active area, whereas the second vertical cross-section lies perpendicular thereto. In the second lateral direction, in which the stripe-shaped field electrode trenches are arranged consecutive in the active area, separate shield electrode trenches, each with a respective shield electrode, can be arranged consecutive in the edge termination structure. These are visible in the second vertical cross-section, see FIG. 4 for illustration. In the first lateral direction, in which the stripe-shaped field electrode trenches have the longitudinal extension in the active area, these elongated trenches can extend up into the edge termination structures and comprise the at least two shield electrodes consecutive in the first lateral direction. These integrated shield electrodes are visible in the first vertical cross-section, see FIG. 3 for illustration.

Basically, the outermost separate trench, which contains the first shield electrode seen in the second vertical cross-section, can extend only along a portion of the active area (e.g. along one side of the die), like the inner separate shield electrode trenches. In particular, however, it can extend further along another side of the die or in particular around the whole active area, forming a closed line. Seen in the first vertical cross-section, this trench can be the "additional shield electrode trench" arranged laterally outside of the common trench, see FIG. 2 and the respective sectional views of FIGS. 3 and 4 for illustration.

In an embodiment relating to the separate trenches seen in the second vertical cross-section, the first trench contains solely the first shield electrode, namely no other shield electrode. In contrast, the second trench contains the second shield electrode and another field electrode below, which can have the same vertical extension and/or be made of the same field electrode material as the first field electrode formed in the active area. The first field electrode and the other field electrode below the second shield electrode can for instance be formed in the same process step or steps (e.g. by deposition and etch back). In general words, in a design with n shield electrodes, the first (outermost) trench can contain solely one electrode, and the $n^{th}$ (innermost) trench can contain n electrodes. Alternatively or in addition, the shield electrodes can have a different vertical extension, e. g. the $(n-1)^{th}$ shield electrode being larger than the $n^{th}$ shield electrode.

In an embodiment, a field dielectric separating the second shield electrode from the semiconductor body has the same thickness as a field dielectric off the second field electrode. If a third or in general words and $n^h$ shield electrode is provided, its field dielectric can have the same thickness as a field dielectric of a third or $n^{th}$ field electrode formed in the field electrode trench. The outermost trench, e.g. the first shield electrode trench in the second cross-section or additional trench in the first cross-section can be deeper and/or wider than the other trenches, and its field dielectric can have the same or a different thickness than the field dielectric of the first field electrode.

In an embodiment, at least one of the shield electrodes is electrically connected to the semiconductor body by a junction element extending through the field dielectric. This junction or junction element can for instance be formed in a local, comparably small cutout of the field dielectric, close to or at the frontside of the semiconductor body. It can for instance be made by a p diffusion. In particular, all shield electrodes can be connected to the semiconductor body, e.g. to the p well, by a respective junction element. With this or these silicon connections, a resistive potential divided can be formed, see the remarks above.

Alternatively or in addition to the direct connection to the semiconductor body, a resistive potential divider can also be formed by a respective wiring in the metallization layer or layers above the semiconductor body. Moreover, in general, the structure can also function without a resistive potential divider or additional stability structures, relying for instance only on the capacitor ratios. Consequently, in some embodiments, no resistive potential divider or silicon connection is provided.

It shall also be disclosed to a method of manufacturing the semiconductor die described here, comprising the steps:
forming the device in the active area of the die;
forming the edge termination structure laterally between the active area and the lateral edge region of the die. Regarding further details, reference is made to the description above.

Further, it shall also be disclosed a use or method of using the die, wherein the shield electrodes are respectively biased to a voltage≤$V_{ds}$/2, see the remarks above for further details.

BRIEF DESCRIPTION OF THE DRAWINGS

Below, the die and its structures are explained in further detail by means of exemplary embodiments. Therein, the individual features can also be relevant in a different combination.

DETAILED DESCRIPTION

Figure 1:
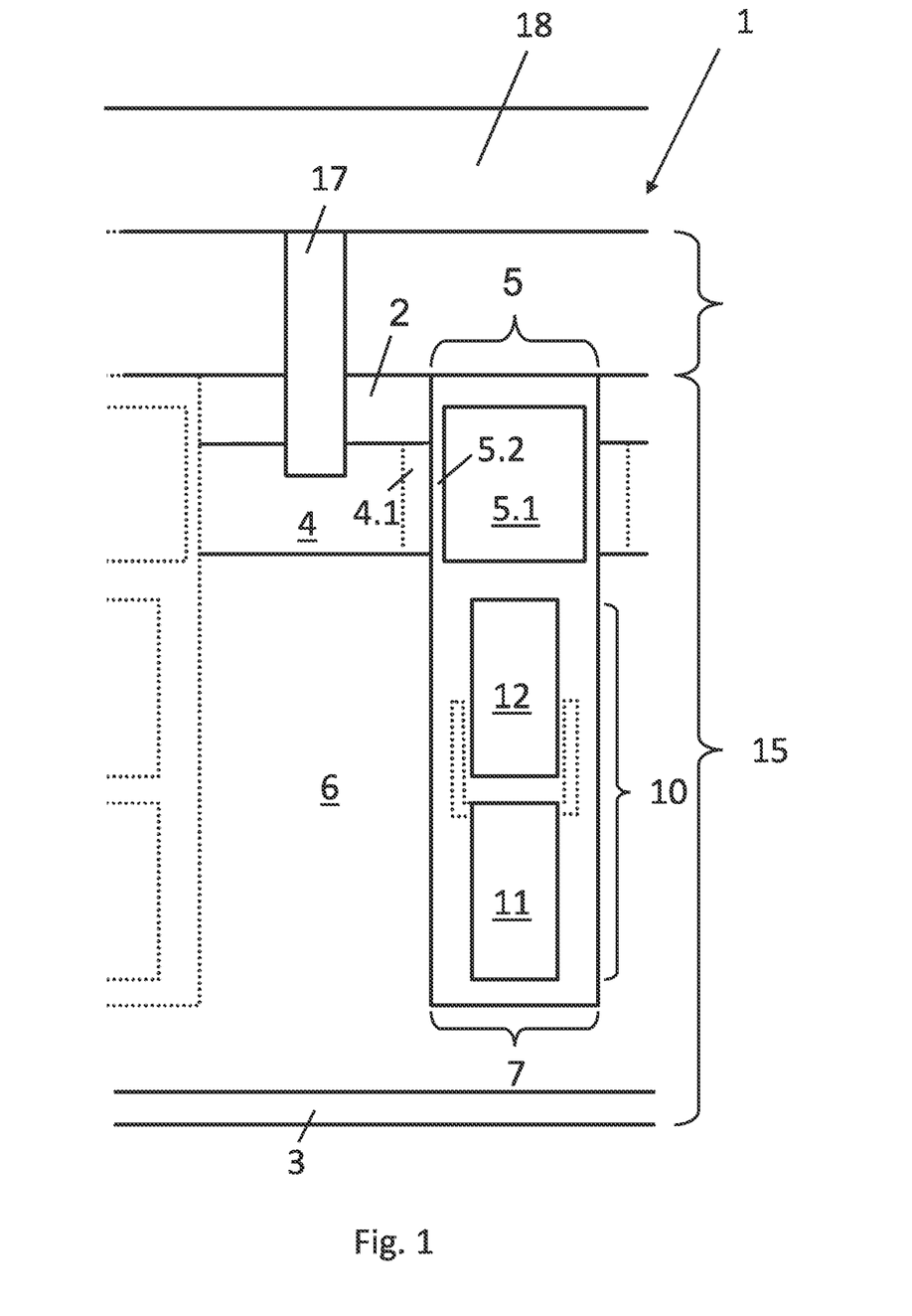
FIG. 1 shows a power device formed in the die, having field electrodes in a field electrode trench.

FIG. 1 shows a device 1, namely an FET. The device 1 comprises a source region 2 at a frontside of a semiconductor body 15 and a drain region 3 at a backside thereof. Vertically in between, a body region 4 and a drift region 6 are formed, the latter being of the same conductivity type as the drain region 3 but having a lower doping concentration. In the example shown, the source and the drain region 2, 3 and the drift region 6 are n-doped, and the body region 4 is p-doped. In the body region 4, a channel region 4.1 is formed laterally aside a gate region 5. The gate region 5 comprises a gate electrode 5.1 and a gate dielectric 5.2 capacitively coupling the gate electrode 5.1 to the channel region 4.1.

Vertically below the gate region 5, a field electrode region 10 is formed, comprising a first and a second field electrode 11, 12. The field electrodes 11, 12 are arranged in a field electrode trench 7 extending into the semiconductor body 15, down into the drift region 6. In the example shown, the gate electrode 5.1 is arranged above in the same trench 7. The dashed lines assigned to the first field electrode 11 illustrate that the field electrodes 11, 12 can also have a certain vertical overlap, e. g. to adapt their capacitive coupling, which is an optional feature. The gate and field electrodes 5.1, 11, 12 are electrically contacted outside the drawing plane. On the frontside of semiconductor body 15, an insulating layer 16 is arranged, e. g. silicon oxide or BPSG. A body contact 17 extends through the insulating layer 16, electrically contacting the body region 4 and the source region 2 to a frontside metallization 18 formed above (source metallization).

Figure 2:
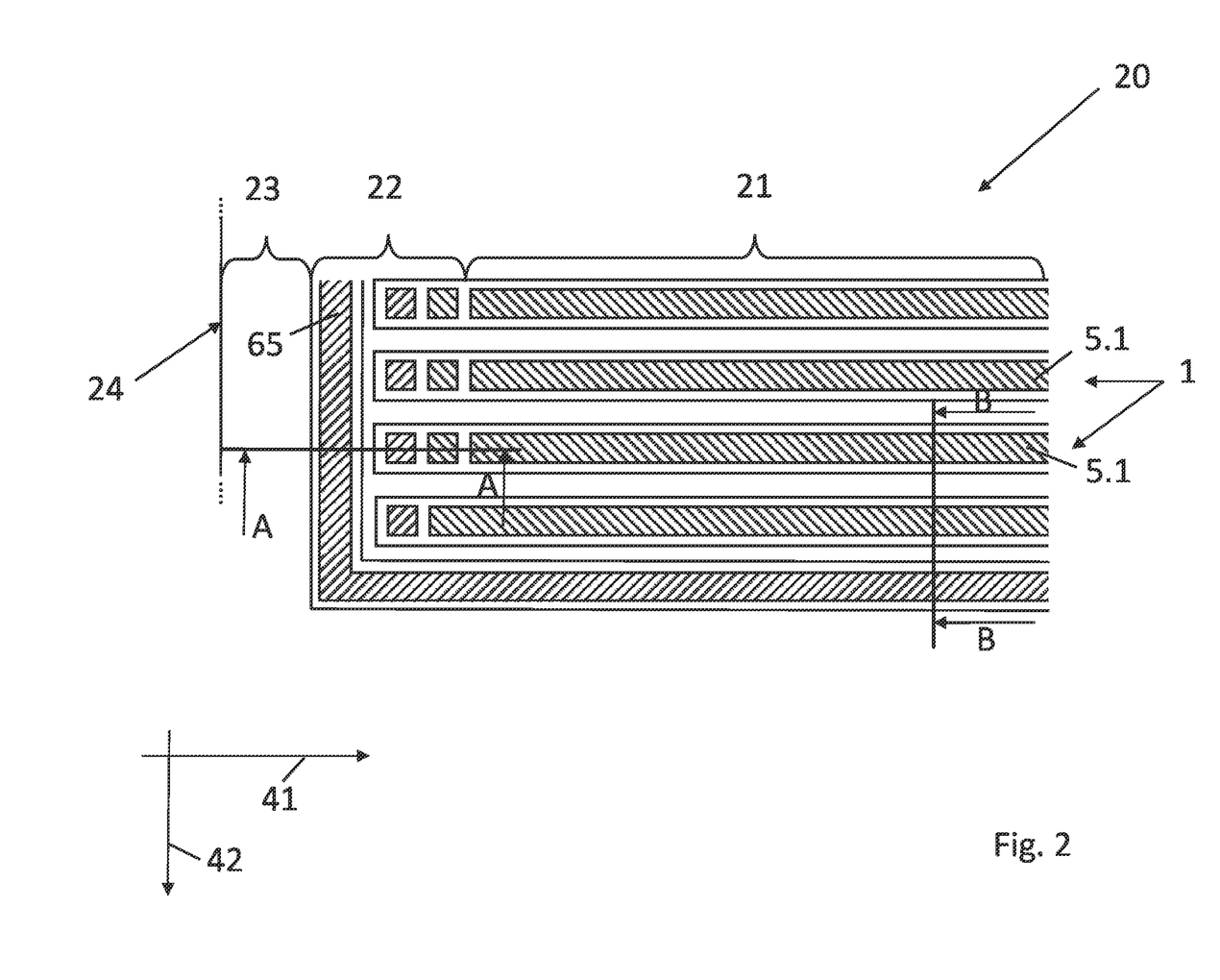
FIG. 2 shows a portion of the die in a vertical top view, illustrating an active area and an edge termination structure.

FIG. 2 shows a die 20 in a vertical top view, wherein the device 1 of FIG. 2 is formed in an active area 21 of the die 20 (a plurality of respective transistor cells connected in parallel are formed there). Generally, in this disclosure, the like reference numerals indicate the same parts or parts with the same function. In addition to the active area 21, an edge termination structure 22 is formed in the die 20, laterally between the active area 21 and a lateral edge region 23 at a lateral edge 24 of the die 20. The edge termination structure 22 surrounds the active area 21, wherein only a portion is shown in FIG. 2.

The edge termination structure 22 comprises shield electrodes as detailed below, which shield the active area 21 from the electrical potential in the lateral edge region 23, which is typically the drain/source potential. The shield electrodes are arranged laterally consecutive in a first and a second lateral direction 41, 42, decreasing the electrical potential stepwise.

FIG. 3 shows the die 20 in a first vertical cross-section parallel to the first lateral direction 41, see the section AA indicated in FIG. 2. In this example, the device 1 comprises two field electrodes 11, 12, and a first and a second shield electrode 31, 32 are arranged consecutive in the first lateral direction 41. The first shield electrode 31 is electrically connected to the first field electrode 11, and the second shield electrode 32 to the second field electrode 12, they are respectively made of the same continuous field electrode material 55.1, 55.2. The laterally consecutive shield electrodes 31, 32 can respectively support a portion of the electrical potential, see the general description in detail.

In FIG. 3, the shield electrodes 31, 32 are arranged in a common trench 35 which is the field electrode trench 7 in the active area 21. A lower end 31.1 of the first shield electrode 31 can be arranged on the same vertical height as a lower end 11.1 of the first field electrode, and a lower end 32.1 of the second shield electrode 32 can be arranged on the same vertical height as a lower end 12.1 of the second field electrode 12. In addition to the common trench 35, an additional trench 70 with an additional shield electrode 65 is formed, which is electrically connected to the first field electrode 31 (connection not shown here). The additional trench 70 surrounds the active area 21 (and forms the first shield electrode trench in the second vertical cross-section, see below). The electrical potential between the additional shield electrode and first shield electrode 31 can be the same as the electrical potential between the first and the second shield electrode 31, 32, e.g. $V_{ds}/2$, whereas it is Vas outside of the additional shield electrode 65 and 0V inside the second shield electrode 32.

Figure 4:
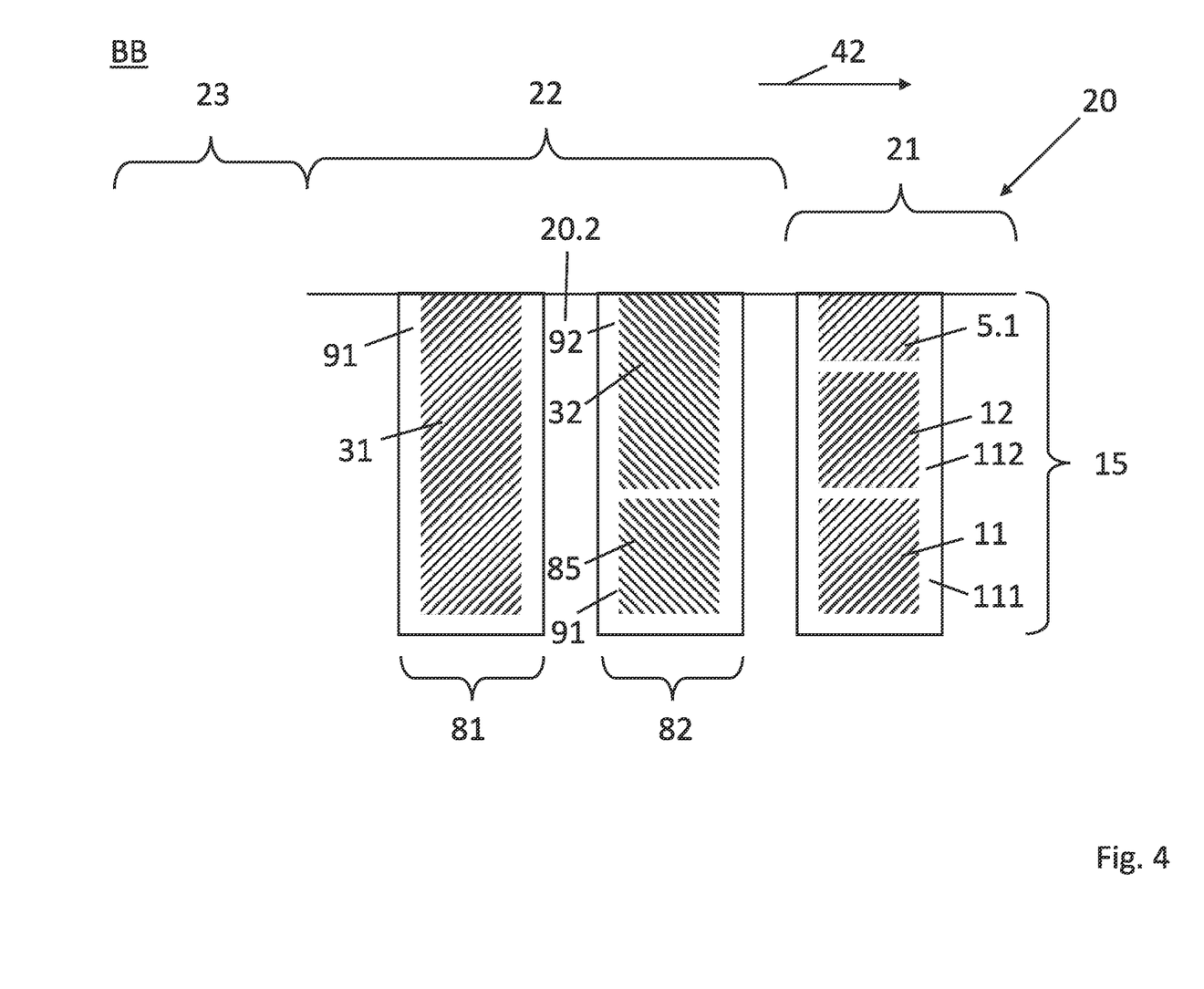
FIG. 4 illustrates the die of FIG. 2 in a second vertical cross-section.

FIG. 4 shows the die 20 in a second vertical cross-section parallel to the second lateral direction 42, see the sectional plane BB indicated in FIG. 2. In the active area 21, the field electrode trench 7 with the gate and field electrodes 5.1, 11, 12 is arranged. In the edge termination structure 22, the first and second shield electrode 31, 32 are arranged laterally consecutive in separate trenches 81, 82. The first shield electrode 31 is arranged in a first trench 81 and second shield electrode 32 is arranged in a second trench 82 separated from the first trench 81 by a portion 15.2 of the semiconductor body 15. Laterally outside of the first field electrode 31 (on the left in FIG. 4), the electrical potential can be Vas, decreasing to $V_{ds}/2$ between the first and second shield electrode trench 81, 82 and to 0V inside the second shield electrode 32 (on the right in FIG. 4).

Perpendicular to the drawing plane, the first trench 81 extends further than the second trench 82 and the field electrode trenches 7, see FIG. 2 for comparison. It extends continuously around the active area 21 and forms the additional trench 70 in the sectional view of FIG. 3. The first trench 81 contains solely the first shield electrode 31. The second trench 82 contains the second shield electrode 32 and another field electrode 85 below, which can be manufactured in the same process step like the first field electrode 11. Consequently, the other field electrode 85 and the first field electrode 11 can have the same vertical extension and position and/or can in particular have respective field dielectrics 91, 111 with the same thickness. Also the second shield electrode 32 and the second field electrode 12 can have respective field dielectrics 92, 112 having the same thickness.

Figure 5:
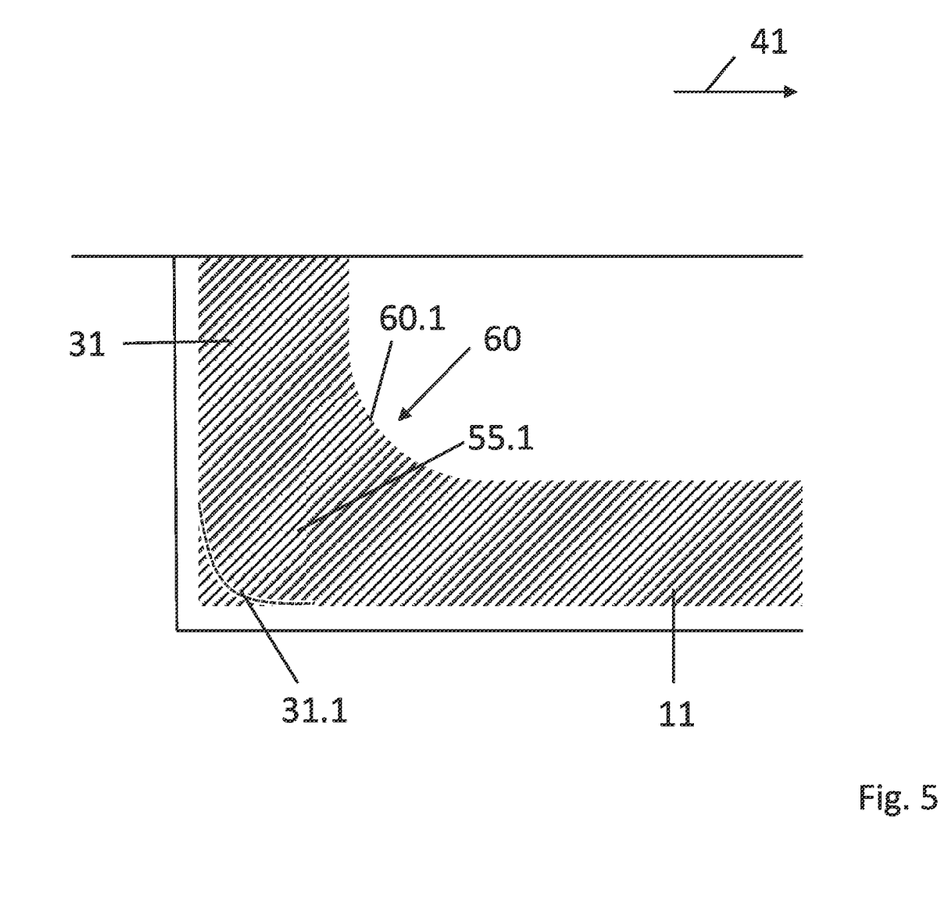
FIG. 5 shows a possibility for forming a transition portion between a field and a shield electrode.

FIG. 5 illustrates an optional design of the first shield electrode 31 and field electrode 11 in the first vertical cross-section, wherein the details are comparable to FIG. 3 but not shown in FIG. 5. An upper edge 60.1 of a transition portion 60 between the first shield electrode 31 and the first field electrode 11 has a curved shape, namely extends concavely. A lower end 31.1 of the first shield electrode 31 can have a curved shape as well, indicated by the dashed line, namely extend convexly.

Figure 6:
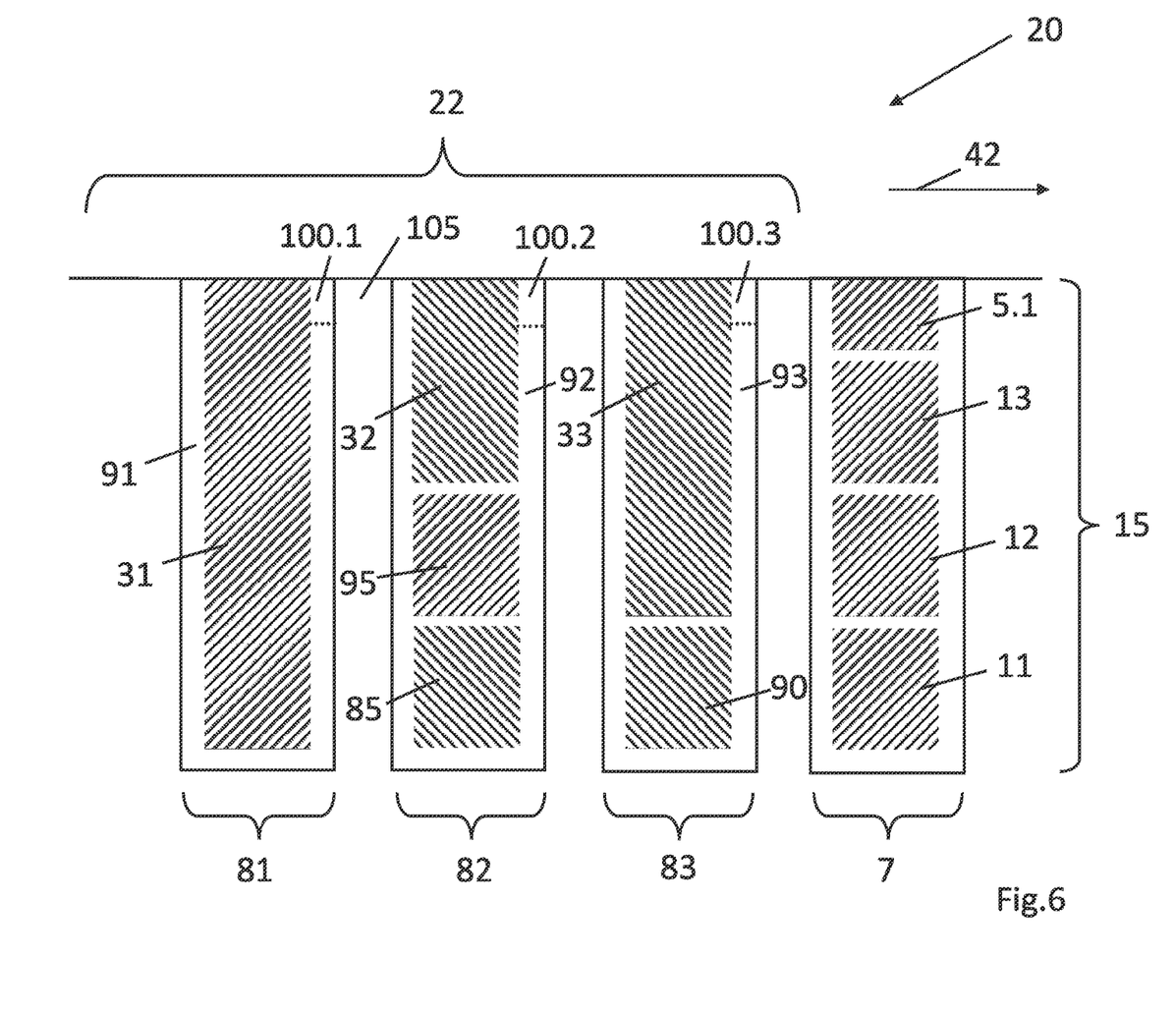
FIG. 6 shows another die with three field and shield electrodes in a second vertical cross-section comparable to FIG. 4.

FIG. 6 illustrates another die 20 in a second vertical cross-section, comparable to the view of FIG. 4. In the field electrode trench 7, a third field electrode 13 is arranged above the second field electrode 12. Accordingly, the edge termination structure 22 comprises a third shield electrode 33 which is formed laterally inside of the second shield electrode 32. Between the first and the second shield electrodes 31, 32, the potential can be $2 \cdot V_{ds}/3$, dropping to $V_{ds}/3$ between the second and the third shield electrodes 32, 33. The third shield electrode 33 is arranged in a third trench 83, in which another field electrode 90 is formed below the third shield electrode. In the second trench 82, a second other field electrode 95 is formed above the other field electrode 85 and below the second shield electrode 32. To form a resistive potential divider, the field dielectrics 91-93 are respectively intersected by a junction element 100.1-100.3, which forms a connection to the well region 105. Alternatively, to form a resistive potential divider, the wiring could be realized in a metallization layer above.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor die, comprising:
    a device in an active area of the die, the device comprising
        a field electrode region formed in a field electrode trench extending vertically into a semiconductor body, wherein the field electrode region comprises a first and a second field electrode stacked vertically above each other in the field electrode trench; and
    an edge termination structure laterally between the active area and a lateral edge region of the die, the edge termination structure comprising a first and a second shield electrode arranged laterally consecutive between the active area and the lateral edge region to stepwise decrease an electrical potential between the edge region and the active area,
    wherein in a first lateral direction, the first and second shield electrodes are arranged in a common trench,
    wherein the common trench is the field electrode trench in the active area.

2. The semiconductor die of claim 1, wherein the first shield electrode is electrically connected to the first field electrode and/or the second shield electrode is electrically connected to the second field electrode.

3. The semiconductor die of claim 1, wherein the first field electrode is arranged vertically below the second field electrode and the first shield electrode is arranged laterally outside of the second shield electrode.

4. The semiconductor die of claim 3, wherein the first shield electrode extends deeper vertically downwards than the second shield electrode.

5. The semiconductor die of claim 3, wherein a lower end of the second shield electrode is arranged on the same vertical height as a lower end of the second field electrode.

6. The semiconductor die of claim 3, further comprising a third field electrode and a third shield electrode, the third field electrode arranged vertically above the second field electrode and the third shield electrode arranged laterally inside of the second shield electrode.

7. The semiconductor die of claim 1, wherein in a first vertical cross-section parallel to the first lateral direction, the first and second shield electrodes are separated from each other by an insulating material layer.

8. The semiconductor die of claim 7, wherein the first shield electrode and the first field electrode are made of a same continuous field electrode material.

9. The semiconductor die of claim 7, wherein in the first vertical cross-section, an upper edge of a transition portion between the first shield electrode and the first field electrode has a curved shape.

10. The semiconductor die of claim 7, further comprising an additional shield electrode in an additional trench, wherein in the first vertical cross-section, the additional shield electrode is separated from the common trench by a portion of the semiconductor body and arranged laterally outside of the common trench.

11. The semiconductor die of claim 10, wherein the additional shield electrode surrounds the active area.

12. The semiconductor die of claim 1, wherein in a second lateral direction transverse to the first lateral direction, the first shield electrode is arranged in a first trench and the second shield electrode is arranged in a second trench, and wherein the first and the second trench are separated from each other by a portion of the semiconductor body.

13. The semiconductor die of claim 12, wherein in a second vertical cross-section parallel to the second lateral direction, the first trench contains solely the first shield electrode and the second trench contains the second shield electrode and another field electrode below the second shield electrode.

14. The semiconductor die of claim 1, wherein a field dielectric of the second shield electrode has the same thickness as a field dielectric of the second field electrode.

15. The semiconductor die of claim 1, wherein at least one of the first and second shield electrodes is electrically connected to the semiconductor body by a junction element extending through a field dielectric of the at least one shield electrode.

16. The semiconductor die of claim 7, wherein the second shield electrode and the second field electrode are made of a same continuous field electrode material.

17. A semiconductor die, comprising:
a device in an active area of the die, the device comprising a field electrode region formed in a field electrode trench extending vertically into a semiconductor body, wherein the field electrode region comprises a first and a second field electrode stacked vertically above each other in the field electrode trench; and
an edge termination structure laterally between the active area and a lateral edge region of the die, the edge termination structure comprising a first and a second shield electrode arranged laterally consecutive between the active area and the lateral edge region to stepwise decrease an electrical potential between the edge region and the active area,
wherein the first field electrode is arranged vertically below the second field electrode and the first shield electrode is arranged laterally outside of the second shield electrode,
wherein a lower end of the second shield electrode is arranged on the same vertical height as a lower end of the second field electrode.

18. A semiconductor die, comprising:
a device in an active area of the die, the device comprising a field electrode region formed in a field electrode trench extending vertically into a semiconductor body, wherein the field electrode region comprises a first and a second field electrode stacked vertically above each other in the field electrode trench; and
an edge termination structure laterally between the active area and a lateral edge region of the die, the edge termination structure comprising a first and a second shield electrode arranged laterally consecutive between the active area and the lateral edge region to stepwise decrease an electrical potential between the edge region and the active area,
wherein in a first vertical cross-section parallel to a first lateral direction, the first and second shield electrodes are separated from each other by an insulating material layer,
wherein in the first vertical cross-section, an upper edge of a transition portion between the first shield electrode and the first field electrode has a curved shape.

* * * * *